United States Patent [19]

Galie et al.

[11] Patent Number: 4,541,168

[45] Date of Patent: Sep. 17, 1985

[54] METHOD FOR MAKING METAL CONTACT STUDS BETWEEN FIRST LEVEL METAL AND REGIONS OF A SEMICONDUCTOR DEVICE COMPATIBLE WITH POLYIMIDE-FILLED DEEP TRENCH ISOLATION SCHEMES

[75] Inventors: John R. Galie, Fishkill; George R. Goth, Poughkeepsie; Thomas A. Hansen, Poughkeepsie; Robert T. Villetto, Jr., Poughkeepsie, all of N.Y.

[73] Assignee: International Business Machines Corporation, Armonk, N.Y.

[21] Appl. No.: 665,829

[22] Filed: Oct. 29, 1984

[51] Int. Cl.[4] .................. H01L 21/312; H01L 21/76; H01L 21/461
[52] U.S. Cl. ........................................ 29/579; 29/591; 29/571; 29/576 W; 148/DIG. 131; 148/DIG. 100; 156/643; 156/650; 357/49
[58] Field of Search ................ 29/571, 578, 591, 579, 29/589, 577 C, 577 R, 576 W; 148/1.5, DIG. 131, DIG. 100; 156/643, 650; 427/88; 357/49, 65

[56] References Cited

U.S. PATENT DOCUMENTS

| | | | |
|---|---|---|---|
| 3,801,880 | 4/1974 | Harada et al. | 317/234 R |
| 4,307,132 | 12/1981 | Chu et al. | 427/90 |
| 4,307,180 | 12/1981 | Pogge | 29/576 W X |
| 4,333,227 | 6/1982 | Horng et al. | 29/576 W X |
| 4,506,434 | 3/1985 | Ogawa et al. | 29/576 W X |

OTHER PUBLICATIONS

IBM, TDB, May 1984, pp. 6506–6507.
IBM, TDB, Mar. 1977, p. 3732.
IBM, TDB, Feb. 1977, p. 3364.
IBM, TDB, Sep. 1978, p. 1464.
IBM, TDB, Feb. 1981, p. 4140.
IBM, TDB, Sep. 1979, p. 1442.

Primary Examiner—Brian E. Hearn
Assistant Examiner—David A. Hey
Attorney, Agent, or Firm—Robert J. Haase

[57] ABSTRACT

The present method discloses the steps to form metal device contact studs between regions of a semiconductor device, such as an NPN vertical bipolar transistor, and the first level metal, the studs overlapping both a contact region (such as the base or the collector) and an adjacent polyimide-filled trench. The method is comprised of the following steps:
(a) applying a lift off mask exposing said contact region and adjacent trench without attacking the polyimide fill,
(b) blanket depositing the stud forming metal onto the whole structure,
(c) lifting off said mask and the overlying metal,
(d) blanket depositing a second dielectric layer onto the whole structure, the thickness of said second layer being approximately the stud height,
(e) removing said second dielectric layer until the top surface of the highest contact stud is exposed and
(f) polishing both the metal and said second dielectric layer to leave a substantially planarized structure ready for further personalization.

10 Claims, 8 Drawing Figures

METHOD FOR MAKING METAL CONTACT STUDS BETWEEN FIRST LEVEL METAL AND REGIONS OF A SEMICONDUCTOR DEVICE COMPATIBLE WITH POLYIMIDE-FILLED DEEP TRENCH ISOLATION SCHEMES

BACKGROUND OF THE INVENTION

1. Field of the Invention

The present invention relates to the manufacture of high performance VLSI semiconductor chips in general and more particularly to a lift-off method for making metal contact studs between first level metal and the desired regions of polyimide-filled deep trench-isolated devices, typically bipolar NPN transistors.

2. Prior Art

Recent developments of advanced semiconductor devices, such as bipolar transistors, have been executed using polysilicon base contacts in conjunction with shallow junctions. There is also a strong tendency to extensively use the polyimide-filled deep trench isolation for denser integration.

Although the polysilicon base contact reduces Ccb and Rb, it adds additional topology steps (0.7 μm) to the master slice structure. Moreover, standard manufacturing techniques of polyimide-filled deep trench isolated devices generally reduce trench widths to a minimum. With conventional metallurgical schemes using the so called first level metal technique, this results in increased metal land capacitance (first level metal to substrate). It also results in primary technology problems of metal thinning (edge coverage) at or over abrupt trench isolation steps and, parasitic FETs which can occur when first level metal conductors lie over thin field dielectrics.

An alternate well-known metallurgical technique consists in employing the stud technique. There is abundant literature concerning that subject, e.g. an article entitled "High current internal contact structure for integrated circuits" by C. E. Benjamin and published in the IBM Technical Disclosure Bulletin, Vol. 19, No. 10, March 1977, page 3732.

According to that article, metal studs are first formed over the individual contact holes in the thermal silicon dioxide layer masking a silicon wafer, before the first level metal is deposited using different photolithography processes.

However, none of the stud contacting art known to the present applicant is directed to semiconductor devices manufactured according to the polyimide-filled deep trench isolation technology. Standard oxygen Reactive Ion Etching (RIE) cannot be used directly with that technology, because the polyimide fill is attached. Furthermore, forming the contact studs using metal RIE or wet sub-etch processes, result in residual metal rails (caused by the anisotropy of this type of etching) or excessive process bias, respectively.

In addition, the problem of implementing metal contact studs overlapping the contact regions and the surface of the trenches adjacent thereto, in order to increase density by alleviating misregistration concerns, has not been addressed at all up to now.

OBJECTS OF THE INVENTION

Therefore it is a primary object of the invention to provide a method for making metal contact studs between first level metal and desired contact regions of a polyimide-filled deep trench isolated device which is not detrimental to the polyimide integrity.

It is another object of the invention to provide a method for making metal contact studs to the desired regions (e.g. base and collector regions) abutted to the trenches of a polyimide-filled deep trench-isolated device (e.g. a bipolar NPN vertical transistor).

It is still another object of the invention to provide a method for making metal contact studs between first level metal and desired contact regions of a polyimide-filled deep trench-isolated device which includes the step of integrating a metal diffusion barrier between the studs and the contact regions for increased reliability of the device.

It is still another object of the invention to provide a method for making metal contact studs between first level metal and desired contact regions of a polyimide filled deep trench-isolated device which includes the step of argon polishing to leave a substantially planarized structure.

It is still another object of the invention to provide a method for making metal contact studs between first level metal and desired metal contacts of a polyimide-filled deep trench semiconductor device which, on the one hand, reduces first level metal to substrate capacitance and, on the other hand, eliminates both metal thinning due to etch back variations of trench fill materials and parasitic FETs problems associated with first level metal running over thin field dielectric films.

SUMMARY OF THE INVENTION

The present invention is a method for making metal contact studs to desired contact regions of active and/or passive semiconductor devices which is fully compatible with the polyimide-filled deep trench technology. First metal interconnections are made to the metal stud instead of directly to the device. As a consequence, the first level metal lands run over a uniform, relatively thick (1.0–2.0 μm), dielectric layer of an insulating material such as silicon nitride, sputtered silicon dioxide, and combination thereof, polyimide, and the like.

A standard manufacturing process is followed until the trench fill and etch back steps have been completed.

The method is comprised of the following steps:

(a) applying a lift-off mask exposing desired regions, including at least one contact region abutting a trench, without attacking organic fill, (b) blanket depositing stud forming metal onto the whole structure, (c) lifting off the lift-off mask and the overlying metal, (d) blanket depositing a second dielectric layer onto the whole structure, the thickness of said second layer being approximately equal to the stud height, (e) removing the second dielectric layer until the top surface of the highest contact stud is exposed and (f) polishing both the metal and the second dielectric layer to leave a substantially planarized structure ready for further personalization.

Personality is then completed using any standard personalization process to achieve three or more levels of interconnection, on a smoothly planarized structure. If desired, the step of forming a metal diffusion barrier between said regions of the semiconductor device and the metal stud may be advantageously and simply integrated in the above method.

The foregoing and other objects, features and advantages of the present invention will be apparent from the following more particular description of a preferred embodiment of it as illustrated in the accompanying drawings forming a material part of the disclosure.

BRIEF DESCRIPTION OF THE DRAWINGS

FIG. 2 shows the formation of the lift-off mask which defines the stud opening pattern in order to expose the desired contact regions of the structure of FIG. 1.

FIG. 3 shows the formation of the metal studs through said lift-off mask in order to make the required electrical contacts with said regions at desired locations of the structure of FIG. 2.

FIG. 4 shows the structure of FIG. 3 after the removal of the lift-off mask and the overlying metal, which leaves only the device metal contact studs.

FIG. 5 shows the structure after a silicon dioxide layer has been deposited onto the structure of FIG. 4 with a thickness approximately equal to the stud height.

FIG. 6 shows the step of applying a photoresist layer onto the structure of FIG. 5 for planarization purposes.

FIG. 7 shows the structure of FIG. 6 after having been etched back to expose the top of the highest stud.

FIG. 8 shows the structure of FIG. 7 after final polishing in an argon atmosphere for smooth planarization.

DESCRIPTION OF THE INVENTION

In the following description, the present invention is described with reference to the fabrication process of a standard advanced integrated circuit where the only active device to be formed is a bipolar transistor, whose isolation is effected by polyimide-filled deep trenches. It should be understood, of course, that various other embodiments of the present invention are realizable.

Inasmuch as conventional bipolar semiconductor processes are followed through the polyimide fill/etch step, the initial prior art processing steps will be described only briefly.

Figure 1:
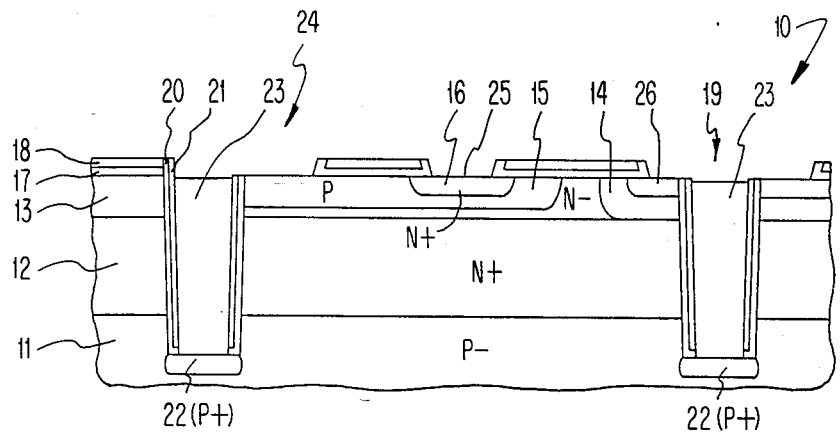
FIG. 1 shows a schematical cross sectional view of a prior art advanced bipolar NPN transistor structure after all master slice processing steps have been completed, including polyimide fill of isolation trenches.

FIG 1 shows, as a non-limiting example, a vertical NPN bipolar transistor isolated by polyimide-filled deep trenches. Other devices, such as diodes, and resistors, for example, also could be provided but are not shown in the interest of clarity of exposition.

The structure 10 is comprised of a $p^-$ boron doped substate 11 having a blanket $N^+$ subcollector 12 and an $N^-$ epitaxial layer 13 thereon. The latter includes a conventional NPN transistor structure comprised of: an $N^+$ reach-through 14, a P base region 15 and an $N^+$ emitter region 16. The structure is passivated with a composite insulating layer of $SiO_2$ ($\simeq$300 nm) and $Si_3N_4$ ($\simeq$100 nm) respectively referenced 17 and 18. The thickness irregularities of both layers, which are representative of the thermal history of the chip during the prior processing steps, have not been represented here for sake of clarity. The silicon nitride layer acts as an oxidation barrier mask to protect the top surface during trench sidewall oxidation. Trenches 19 have been formed through the structure until substrate 11 has been reached. As known, the trenches define isolated pockets of portions of the epitaxial layer where active and/or passive devices are formed.

A thermally grown $SiO_2$ layer 20 (50–150 nm) and a Chemical Vapor Deposited $Si_3N_4$ layer 21, coat the trench sidewalls. There is a channel stopper 22 at the bottom of the trenches to prevent undesirable effects caused by channel inversion between the subcollectors of two adjacent pockets.

Figure 2:
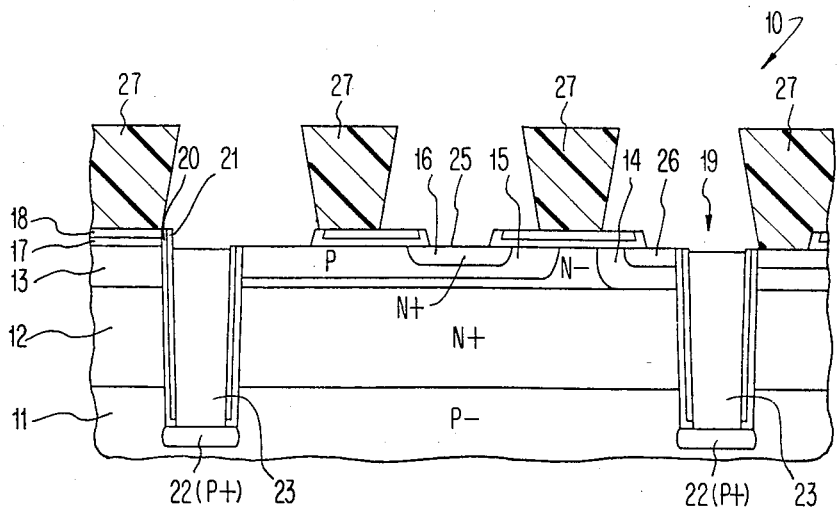
FIGS. 2 to 8 illustrate successive cross sectional views of the structure of FIG. 1 undergoing the subsequent steps of making metal device contact studs according to the teachings of the present invention.

The trenches are filled with an organic insulating material, such as polyimide, bearing reference 23 in FIG. 1. All the required contact openings have been etched through the composite $SiO_2/Si_3N_4$ layer. The contact openings with the base, emitter and collector regions of structure 10 are respectively reference 24, 25 and 26. It is common practice that platinum-silicide (Pt-Si) be formed in these contact regions for improved interconnection. It is very important to understand that, at this stage the top surface of the polyimide-filled trenches 19 is exposed. The topology at the locations where the contact regions abut the trenches result from a prior back etch step. From that stage, the process proceeds as described in the following steps:

Forming the contact stud mask (FIG. 2)

A special lift-off process has been developed to delineate the desired stud opening pattern without attacking the underlying polyimide. The wafers are first cleaned in acetone for 5 min., then rinsed, and dried. An adhesion promoter, such as Hexa-Methyl-DiSilazane (HMDS) is applied, then baked at 160° C. for 30 min. A photoresist such as the diazo resist AZ 1350J, with 1% imidazole is deposited onto the structure to form a 3 $\mu$m thick layer 27. The wafer is baked at 80° C. for 30 min., and then is exposed to the desired pattern. After a post-exposure bake at 90° C. for 20 min., the image is developed with an image stripper which selectively removes the photoresist but is inactive with the polyimide. A potassium hydroxide (KOH) solution at 0.095N is appropriate. Over developing is necessary to fully clean the contact regions and assure that the sidewalls of the mask will have a negative profile as shown to exhibit the desired undercut required for a secure metal deposition. The polyimide acts as an etch stopper.

Figure 3:
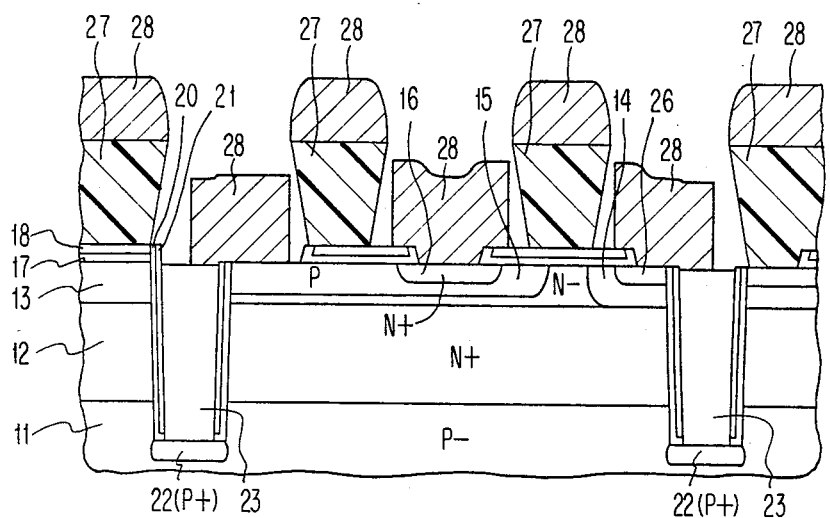

Depositing the metal stud layer (FIG. 3)

This step is directed to the deposition of the device contact stud metal layer. According to a preferred embodiment, a metal diffusion barrier for a better device contact is provided. The wafer is pre-cleaned for instance in buffered HF (40:1) for 20 sec., then rinsed and dried. Water bleed Cr-Al-Cu is evaporated onto the structure with no substrate heat (<100° C.). A Cr barrier is provided, although other known evaporated metal barriers may be used as well. A metal evaporation temperature must be controlled to be equal to or less than 100° C. to avoid reflow of the lift-off mask. The recommended different film thicknesses are: $Cr_2O_3$ barrier: 140 nm, Al-Cu stud: 2100 nm (compare with the photoresist thickness: 3000 nm). At this stage of the process, the resulting structure is shown in FIG. 3 from which it is apparent that the metal layer 28 provides device contacts with the base, emitter and collector regions of bipolar transistor structure 10.

Figure 4:
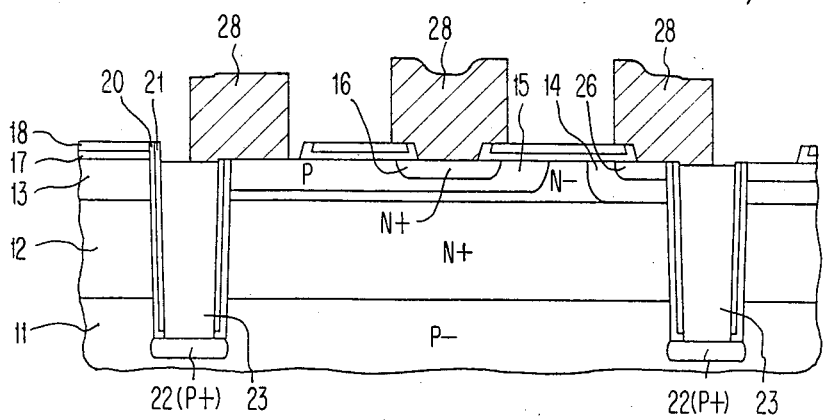

Contact stud lift-off (FIG. 4)

The wafer is dipped in an N-Methyl-Pyrrolidone (NMP) or any other suitable solvent bath at 135° C. and agitated for 2 min. Then, the wafer is successively dipped in acetone for 10 min, in a resist stripper such as J 100 (a solvent sold by Indust-RI-Chemical Laboratory Inc., Richardson, Texas) for 15 min. at 98° C., and in acetone for 10 min. The wafer is then rinsed and spin dried. All the metal is removed with the lift-off structure, except the device contact studs.

It is to be noted, as apparent from FIG. 4, that there are two categories of contacts: normal contact with the emitter and butted contact with the base and collector regions which come in abutment with a trench. With the latter contacts, the studs are partly overlying the adjacent polyimide-filled trench. This results in a significant increase of the density of devices integrated in the wafer and in addition allows to have a more tolerant process from a misregistration point of view.

Stud bake

Baking the structure at 230° C. during 30 min. is recommended, to bake-out any absorbed solvents from the polyimide trench fill, due to lift-off chemicals.

Figure 5:
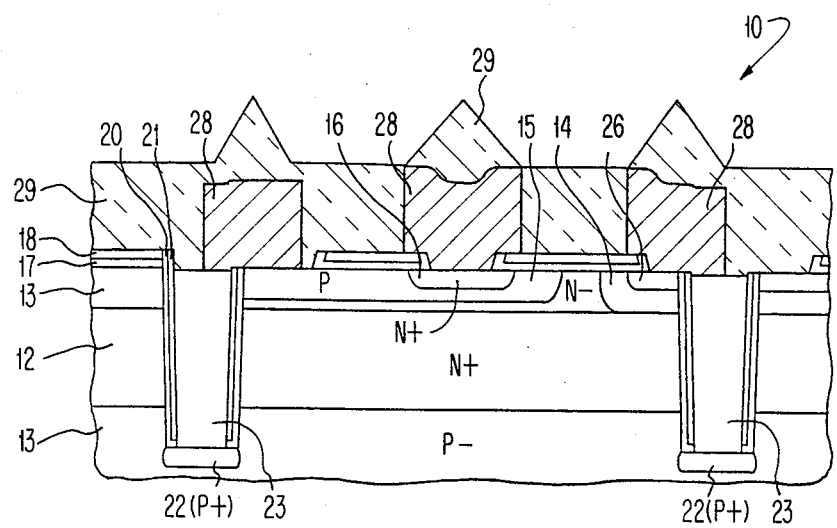

Deposition of sputtered $SiO_2$ (FIG. 5)

A layer of an insulating material, such as silicon dioxide, is deposited to establish the layer thickness close to the stud height ($\simeq 2.2$ μm). The wafer is baked in a furnace at 400° C. for 30 min. and the top polyimide surface (20–30 nm) is removed by ashing.

A layer 29 of $SiO_2$ with a thickness of 2600 nm is sputter deposited in a standard 13.6 MHz equipment to produce the structure of FIG. 5, with its typical irregular surface exhibiting peaks above the studs.

Figure 6:
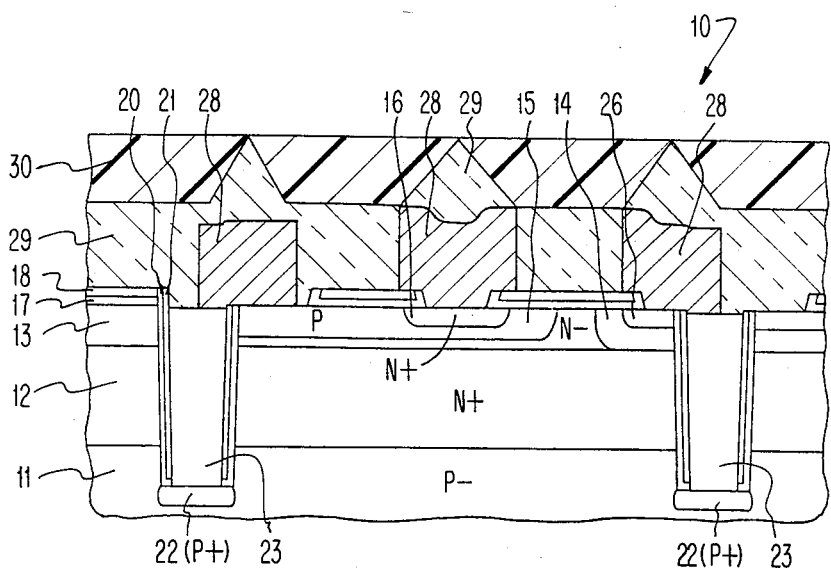

Photoresist apply (FIG. 6)

The purpose of this step is to roughly planarize the insulator topography and to expose the top of the highest contact stud. The wafer is pre-cleaned in acetone for 5 min., rinsed in de-ionized water, spin dried and then, baked in an oven at 160° C. for 30 min. A photoresist material, such as AZ1350 J (diluted 5:1) is applied in order to produce a 2100 nm thick layer 30, as depicted in FIG. 6, then baked again in the same conditions as mentioned above. The photoresist is etched at approximately the same rate as that of the $SiO_2$. AZ1350 J is appropriate in that respect, however, other materials such as polyimides may be used.

Figure 7:
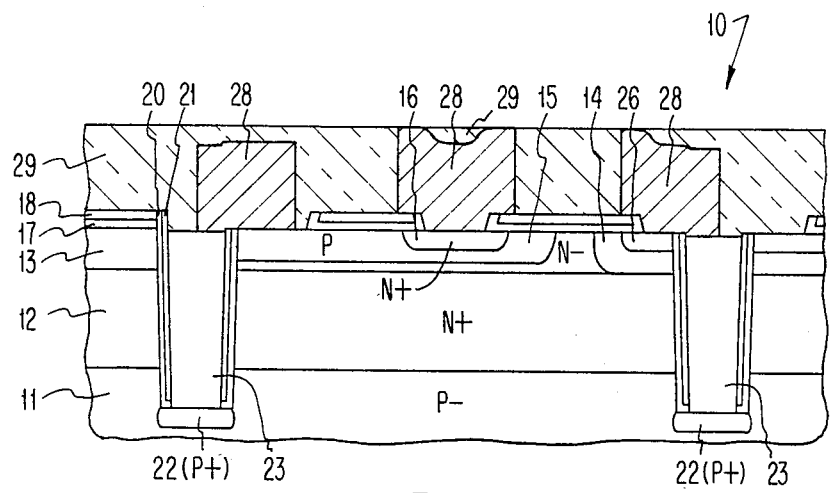

Photoresist etch back (FIG. 7)

The wafer is introduced in a plasma etcher tool; the preferred etching gas is a mixture of $CF_4$ and $O_2$ (8%). The operating parameters are:
flow: 50 scc/min.
pressure: 100 μm
power: 1350 watts.
These parameters achieve equal removal rate of resist and $SiO_2$. The resulting structure is shown in FIG. 7. As it may be seen the top surface of studs is only partially exposed.

Figure 8:
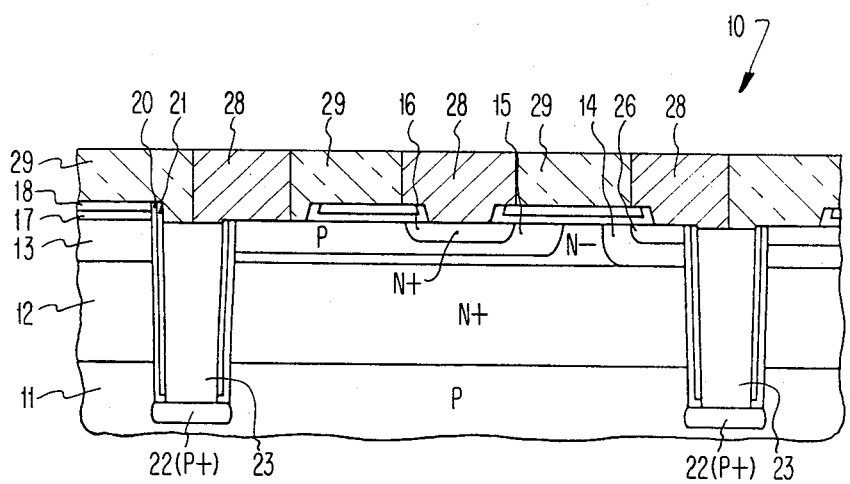

Final argon polishing (FIG. 8)

It is preferred to add an additional step for enhanced planarization. This may be effected, in a parallel plate sputter etch tool of the Reinberg type with an argon atmosphere and the following conditions:
power: 2000 watts
pressure: 25 μm
flow: 100 scc/min.
power density: 0.75 watts/cm²
The use of a quartz electrode is recommended.
Etch rates are 22 nm and 23 nm for AlCu and $SiO_2$ respectively. Because the etching rates of AlCu and $SiO_2$ are substantially identical, an excellent planarization of the top surface of the structure is obtained.

The wafer is now ready for subsequent standard processing steps to achieve the final structure. These steps will not be detailed as they are not a material part of the present invention.

CONCLUSION

As a result of the present method of forming device metal studs in advanced technologies using the polyimide-filled deep trench isolation scheme, compatibility with advanced transistors and personalization processes, and substantial planarization are achieved. In addition, yield related problems associated with metal thinning at trench edges and parasitic FETs are resolved. Finally, a major reduction in the land capacitance of the first level interconnection metal will provide significant, additional performance enhancement to circuit types such as, for example, TTL and DTL.

While there has been shown and described what is considered at present to be the preferred embodiment of the present invention, it will be appreciated by those skilled in the art that modifications of such embodiment may be made. It is therefore desired that the invention not be limited to this embodiment, and it is intended to cover in the appended claims all such modifications as fall within the true spirit and scope of the invention.

What is claimed is:

1. The method for making device metal contact studs to desired contact regions of an organic material-filled deep trench isolated semiconductor device passivated by a first dielectric layer according to a determined pattern exposing at least the desired regions of the structure where the studs are to be made, said method comprising the steps of
   (a) applying a lift-off mask exposing said desired regions including at least one contact region abutting a trench, without attacking said organic fill,
   (b) blanket depositing the stud forming metal onto the whole structure,
   (c) lifting off said mask and the overlying metal,
   (d) blanket depositing a second dielectric layer onto the whole structure, the thickness of said second layer being approximately the same as the stud height,
   (e) removing said second dielectric layer until the top surface of the highest contact stud is exposed and
   (f) polishing both the metal and said second dielectric layer to leave a substantially planarized structure ready for further personalization.

2. The method of claim 1 wherein step (e) comprises the steps of
   planarizing the structure with a material which is etchable at approximately the same rate as said second dielectric layer and,
   etching both said material and second dielectric layer.

3. The method of claim 1 wherein step (a) comprises the steps of
   depositing a film of a diazo photoresist containing about 1% imidazole
   exposing according to the desired stud opening pattern and,
   overdeveloping the image with a developer which does not attack said organic fill, the latter acting as an etch-stop for the developer.

4. The method of claim 3 wherein said developer is a KOH solution.

5. The method of claim 1 wherein the step of polishing comprises the step of
   placing the structure in a sputter etch tool in an argon atmosphere to etch said second dielectric layer and said metal at approximately the same rate until all the top surfaces of the studs are exposed.

6. The method of claim 5 wherein the sputter etching operating conditions are
   power: 2000 watts
   pressure: 25 μm
   flow: 100 scc/min.
   power density: 0.75 watts/cm$^2$.

7. The method of claim 1 wherein step (b) further includes the step of forming a metal diffusion barrier placed between the contact regions and the studs.

8. The method of claim 7 wherein the metal diffusion barrier consists of $Cr_2O_3$ and is formed in the same equipment just prior the stud formation by water bleeding Cr and then Al/Cu.

9. The method of claim 1 wherein step (b) is followed by the step of baking the structure to bake out any absorbed solvents from the organic trench fill.

10. The method of claim 1 wherein said organic material is polyimide.

* * * * *